(12) United States Patent
Fon

(10) Patent No.: US 12,542,560 B2
(45) Date of Patent: Feb. 3, 2026

(54) TESTING ADCs

(71) Applicant: Nordic Semiconductor ASA, Trondheim (NO)

(72) Inventor: Henrik Fon, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 201 days.

(21) Appl. No.: 18/285,217

(22) PCT Filed: Mar. 31, 2022

(86) PCT No.: PCT/EP2022/058605
§ 371 (c)(1),
(2) Date: Sep. 29, 2023

(87) PCT Pub. No.: WO2022/207807
PCT Pub. Date: Oct. 6, 2022

(65) Prior Publication Data
US 2024/0187014 A1 Jun. 6, 2024

(30) Foreign Application Priority Data
Mar. 31, 2021 (GB) .................................... 2104628

(51) Int. Cl.
*H03M 1/10* (2006.01)
*H03M 1/06* (2006.01)
*H03M 1/12* (2006.01)
*H03M 1/18* (2006.01)
*H03M 1/38* (2006.01)

(52) U.S. Cl.
CPC ......... *H03M 1/109* (2013.01); *H03M 1/0624* (2013.01); *H03M 1/1095* (2013.01); *H03M 1/182* (2013.01); *H03M 1/38* (2013.01); *H03M 1/125* (2013.01)

(58) Field of Classification Search
CPC ........ H03M 1/109; H03M 1/182; H03M 1/38; H03M 1/125; H03M 1/1095; H03M 1/0624
USPC ......................................................... 341/120
See application file for complete search history.

(56) References Cited

U.S. PATENT DOCUMENTS 8,994,568 B2 * 3/2015 Nagarajan ............. G06F 1/3296
341/120
9,379,726 B1 6/2016 Wang et al.
2014/0247170 A1 9/2014 Nagarajan et al.

OTHER PUBLICATIONS

IPO Combined Search and Examination Report under Sections 17 and 18(3) for Great Britain Application No. 2104628.9, mailed Sep. 21, 2021, 6 pages.

(Continued)

Primary Examiner — Khai M Nguyen
(74) Attorney, Agent, or Firm — Klarquist Sparkman, LLP

(57) ABSTRACT

A circuit portion is provided which is arranged to be operable in a test mode. The circuit portion includes a Successive Approximation Register Analog to Digital Converter, SAR ADC, and an input for a reference signal. The SAR ADC is arranged to generate a feedback signal having a duty cycle representing a time taken for the SAR ADC to complete an analogue to digital conversion. The SAR ADC can carry out a comparison of a duty cycle of the reference signal with the duty cycle of the feedback signal, and can generate an output signal comprising a digital representation of the comparison of the reference duty cycle and the feedback duty cycle.

14 Claims, 5 Drawing Sheets

(56) References Cited

OTHER PUBLICATIONS

International Search Report and Written Opinion for PCT/EP2022/058605, mailed Nov. 28, 2022, 13 pages.

\* cited by examiner

TESTING ADCs

CROSS REFERENCE TO RELATED APPLICATIONS

This is the U.S. National Stage of International Application No. PCT/EP2022/058605, filed Mar. 31, 2022, which was published in English under PCT Article 21(2), which in turn claims the benefit of Great Britain Application No. 2104628.9, filed Mar. 31, 2021.

This invention relates to testing Successive Approximation Register Analogue to Digital Converters (SAR ADCs), in particular, for testing the timing margin of SAR ADCs.

It is known to use Successive Approximation Register Analogue to Digital Converters (SAR ADCs) to convert analogue waveforms into a corresponding digital representation.

A typical SAR ADC comprises a Successive Approximation register (SAR) which feeds multi-bit binary codes into a digital to analogue converter (DAC). During an analogue to digital conversion the SAR ADC performs a binary search to find the correct digital input to the DAC.

The sampling and conversion phase of the SAR ADC is controlled by an associated sampling clock. SAR ADCs perform bit conversions asynchronously to the sampling clock. The conversion takes a certain amount of time, typically in the range of nanoseconds to microseconds and the SAR ADC must finish the conversion before a new sampling stage starts. However the conversion time can vary significantly over PVT (process-voltage-temperature) variations and with layout parasitics. This can present difficulties in ensuring that the conversion time is suitable for the sampling rate and does not present undue delays for other parts of the circuit (where the result of the ADC conversion is needed).

The present invention seeks to address this and from a first aspect provides a circuit portion arranged to be operable in a test mode, comprising:
- an input for a reference signal; and
- a Successive Approximation Register Analog to Digital Converter (SAR ADC) arranged to:
  - generate a feedback signal having a duty cycle representing a time taken for the SAR ADC to complete an analogue to digital conversion;
  - carry out a comparison of a duty cycle of the reference signal with the duty cycle of the feedback signal; and
  - generate an output signal comprising a digital representation of the comparison of the reference duty cycle and the feedback duty cycle.

From a second aspect, the invention provides a method for testing a Successive Approximation Register Analog to Digital Converter (SAR ADC), the method comprising the SAR ADC in a test mode:
- generating a feedback signal having a duty cycle representing a time taken for the SAR ADC to complete an analogue to digital conversion;
- carrying out a comparison of a duty cycle of the reference signal with the duty cycle of the feedback signal; and
- generating an output signal comprising a digital representation of the comparison of the reference duty cycle and the feedback duty cycle.

Thus it will be seen by those skilled in the art that, in accordance with the invention, a circuit portion effectively routes the feedback signal generated at the SAR ADC in such a way that the SAR ADC can compare its duty cycle with that of the reference signal. The output signal comprises a digital representation of that comparison and may therefore provide information related to the time taken for the SAR ADC to complete an analogue to digital conversion—e.g. the timing margin of the SAR ADC—because the feedback signal has a duty cycle derived from the conversion time of the SAR ADC.

This may be useful when testing the SAR ADC during production testing as it provides a way of determining the conversion time of a particular SAR ADC after it has been implemented into a chip layout because, as mentioned above, this can vary significantly over PVT variations and with layout parasitics (e.g. causing parasitic capacitance). The information related to the conversion time (or timing margin) of the SAR ADC obtained in accordance with the invention can, for example be used to decide to pass or fail criterion the chip—e.g. a threshold output code (digital representation) can be set and if the SAR ADC does not meet the criterion (e.g. if the output code is higher than the threshold) then the chip comprising the circuit portion may be discarded. When implemented on-chip, the circuit portion allows for 'built-in' SAR ADC testing. Therefore, the circuit portion may provide a way to test the SAR ADC conversion time without the need for external test equipment.

In a set of embodiments, the circuit portion comprises:
- a first sub-portion arranged to generate a reference DC voltage representative of the reference duty cycle; and
- a second sub-portion arranged to generate a feedback DC voltage representative of the feedback duty cycle;
- wherein the SAR ADC is arranged to compare the reference DC voltage with the feedback DC voltage.

In a set of embodiments, the first and second sub-portions are identical to one another—i.e. they comprise matched components. By having identical circuit arrangements process the reference signal and feedback signal, other factors such as PVT variations therein will cancel out so that the DC voltages representing the reference and feedback duty cycles can be more accurately compared by the SAR ADC.

In a set of embodiments, the first and second circuit sub-portions comprise respective low-pass filters. The low-pass filters may convert the digital input duty cycle to a DC voltage representing said duty cycle.

In a set of embodiments, the first and second circuit sub-portions further comprise respective buffers.

The reference signal, having a reference duty cycle, may be provided by any suitable oscillator. In a set of embodiments, the circuit portion comprises or is connected to a clock (e.g. a sampling clock). The clock may provide the reference signal to the SAR ADC. The clock providing the reference signal may also be used to clock the SAR ADC.

The feedback signal has a duty cycle (or pulse width) related to the conversion time of the SAR ADC. The feedback signal may be a binary signal. In a set of embodiments, the SAR ADC sets the feedback signal to logic low (or "0") when a sampling stage begins and logic high (or "1") when the analogue to digital conversion is done. Therefore, the feedback signal may be referred to as a "DONE" signal. Such a sampling stage may begin when the sampling clock goes high and the SAR ADC resets.

As previously mentioned, the comparison carried out by the SAR ADC allows for the generation of an output signal comprising a digital representation of the comparison of the reference and feedback duty cycle. The reference duty cycle may be periodic, e.g. from a clock, and the feedback duty cycle represents the time taken for the SAR ADC to complete an analogue to digital conversion. Therefore, the comparison of those duty cycles may result in an output signal comprising information derived from the time taken for the SAR ADC to complete an analogue to digital conversion, e.g. the information being the timing margin of the conversion. The timing margin can be described as the difference between an actual change in signal (i.e. when the output of the conversion is generated by the SAR ADC) and the latest possible time at which the signal can be changed for the circuit to function correctly. In a set of embodiments, the comparison comprises determining a value proportional to a timing margin of the analogue to digital conversion. A quicker conversion will give a higher timing margin. Trimming may be done (e.g. to parameters or components of the circuit) based on the timing margin determined in the test mode. Alternatively, the SAR ADC may be rejected if the timing margin does not meet a predetermined standard.

The circuit portion may be implemented on-chip, thus, allowing for a built-in self-test, at any time, with no external test equipment required. The circuit portion will also typically be arranged to operate in a normal mode. In a set of embodiments, the circuit portion is configurable to selectively connect a further circuit portion to the SAR ADC, so as to operate in the normal mode when the further circuit portion is connected to the SAR ADC and in the test mode when the further circuit portion is not connected to the SAR ADC. Preferably, when operating in the normal mode, signals representing the reference and feedback duty cycles are not fed to the SAR ADC inputs although the SAR ADC will typically still be clocked by the sampling clock. In such a set of embodiments, the circuit portion may be configured to enter the test mode at any stage, therefore, allowing a self-test to be performed at any time.

In a set of embodiments, the circuit portion comprises a plurality switches for selection of said normal and test modes. In such a set of embodiments, when a first plurality of switches are closed and a second plurality of switches are open, the circuit portion operates in the test mode. Similarly, when the first plurality of switches are open and a second plurality of switches are closed, the circuit portion operates in the normal mode. Therefore, the circuit portion may be switched between the test mode and the normal mode by selectively opening and closing switches, which preferably change how inputs to the SAR ADC are arranged. The switches help to allow the circuit portion to efficiently change from the test mode to the normal mode and vice versa. The test mode may be selected in production stages. After the production stages, the normal mode may be selected. However, if desired, the test mode may be selected at other times—e.g. during use of chip containing the circuit portion or during commissioning of such a chip in an end product. This means that testing of the SAR ADC may be performed at any time, any number of times. The plurality of switches may therefore help to provide more flexibility to built-in SAR ADC testing.

In a set of embodiments, the SAR ADC comprises a differential input. The differential input may receive a feedback input representative of the feedback duty cycle and a reference input representative of the reference duty cycle in the test mode. The differential input may receive a differential input voltage from a further circuit portion in a normal mode. Having a differential input may improve the signal-to-noise-distortion-ratio of the input from the further circuit portion. The differential input may also help to subtract common mode errors.

Another possible advantage of the invention is that it allows the supply voltage to the SAR ADC to be tuned to provide an acceptable result (e.g. an acceptable timing margin). This contrasts with known approaches in which a supply voltage is used that is higher than may be necessary in a bid to ensure that an acceptable conversion time is achieved despite PVT variations. By not overcompensating with a supply voltage that is higher than required, the typical power consumption of an average SAR ADC may be reduced. The supply voltage could be set manually based on the output from the SAR ADC representing the conversion time, but advantageously it is set automatically.

In a set of embodiments therefore, the circuit portion comprises or is connected to a power supply arranged to provide a supply voltage to the SAR ADC, the supply voltage being set based on the comparison of the reference duty cycle and feedback duty cycle. Such embodiments may be beneficial for performing automatic production adjustments of the SAR ADC voltage supply.

In a set of embodiments, the supply voltage is set automatically by a control unit. The control unit may be configured to receive a signal from the SAR ADC and then set the supply voltage based on said signal. The control unit may comprise a connection to a voltage controller. In this way, the control unit can adjust the supply voltage via the connection to the voltage controller.

Setting the supply voltage to the SAR ADC based on the time taken for the SAR ADC to perform an analogue to digital conversion, is novel and inventive in its own right. Therefore, when viewed from a third aspect, the invention provides a circuit portion arranged to be operable in a test mode, comprising:
  a Successive Approximation Register Analog to Digital Converter (SAR ADC); and
  a power supply arranged to provide a supply voltage to the SAR ADC;
  wherein the circuit portion is arranged to measure a parameter indicative of a time taken for the SAR ADC to perform an analogue to digital conversion and set the supply voltage based on the measurement of said parameter.

From a fourth aspect the invention provides a method for testing a Successive Approximation Register Analog to Digital Converter (SAR ADC), the method comprising:
  measuring a parameter indicative of a time taken for the SAR ADC to perform an analogue to digital conversion; and
  setting a supply voltage to the SAR ADC based on the measurement of said parameter.

Features of any aspect or embodiment described herein may, wherever appropriate, be applied to any other aspect or embodiment described herein. Where reference is made to different embodiments or sets of embodiments, it should be understood that these are not necessarily distinct but may overlap.

It will be appreciated by those skilled in the art that all aspects and embodiments of the present invention can include, as appropriate, any one or more or all of the preferred and optional features described herein.

Certain preferred embodiments of the invention will now be described, by way of example only, with reference to the accompanying drawings, in which.

Figure 1:
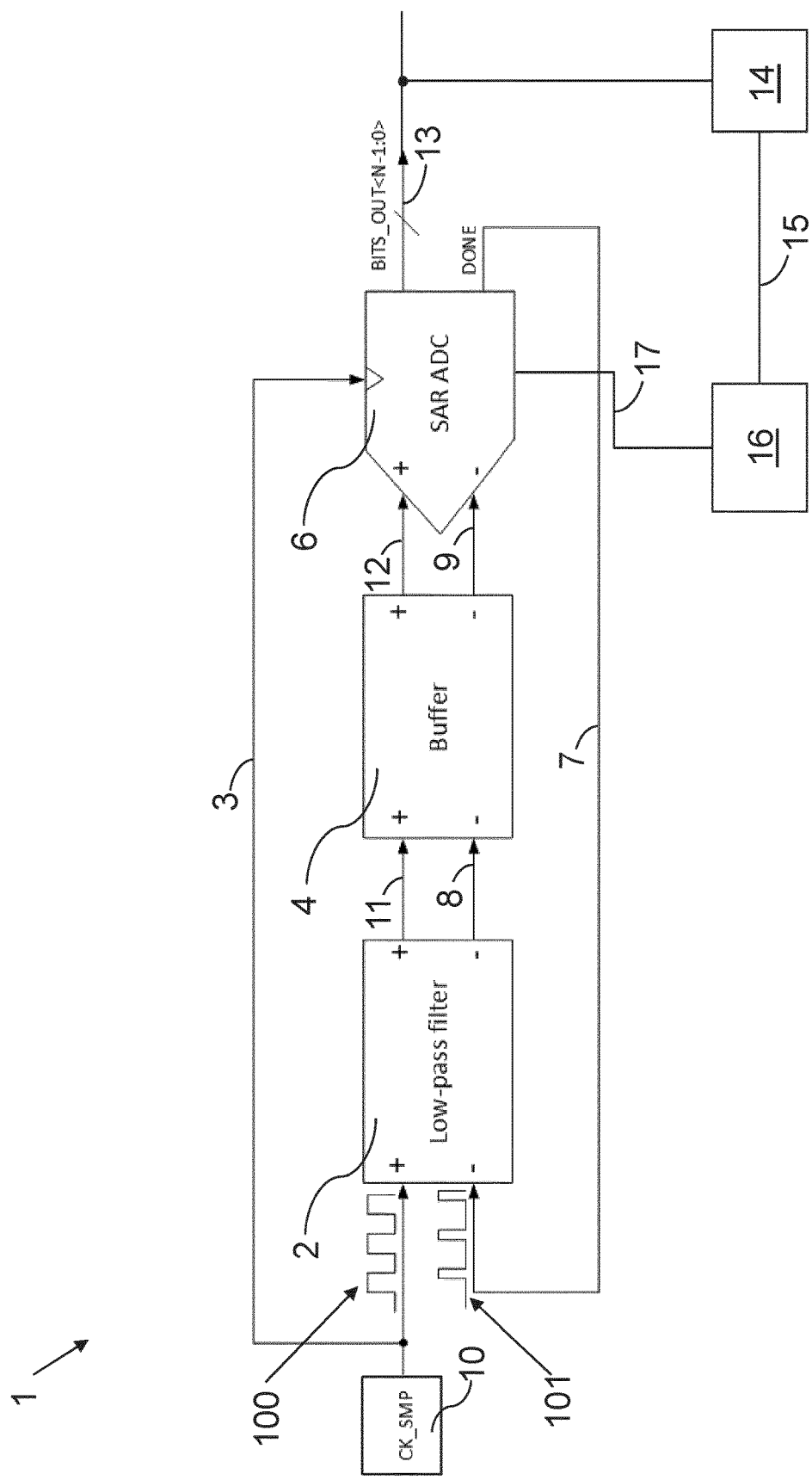
FIG. 1 is a schematic of a circuit portion according to an embodiment of the invention.

FIG. 1 shows a circuit portion 1 arranged to be operable in a test mode for testing the timing of an SAR ADC 6 (Successive Approximation Register Analog-to-Digital Converter), e.g. an 11-bit SAR ADC. The SAR ADC 6 is clocked by a sampling clock 10 producing a clock signal 100 (via connection 3). The sampling clock 10 is connected to a low-pass filter block 2 which is connected to a buffer block 4 (or source follower). The buffer block 4 is connected to differential inputs 9,12 of the SAR ADC 6 so that the clock signal 100 passes along one channel of the low pass filter block 2, the output 11 of which passes into one channel of the buffer block 4 and then into the non-inverting input 12 of the SAR ADC.

The SAR ADC 6 has two outputs 7, 13. The first, feedback output (labelled "DONE") 7 is connected to a second channel of the low-pass filter block 2 to provide a feedback signal 101. The output 8 from this channel passes through a second channel of the buffer block 4 to the inverting input 9 of the SAR ADC. In other words, the circuit portion 1 comprises a first sub-portion and a second sub-portion which comprise identical components. The first sub-portion of the circuit portion 1 comprises the first channel between the sampling clock 10 and the SAR ADC 6. The second sub-portion of the circuit portion 1 comprises the second channel between the feedback output 7 and the SAR ADC 6.

The second output 13 of the SAR ADC is connected to a control module 14 which controls a power supply voltage controller 16 via a control connection 15. The power supply voltage controller 16 provides power through a connection 17 to the SAR ADC 6.

Figure 2:
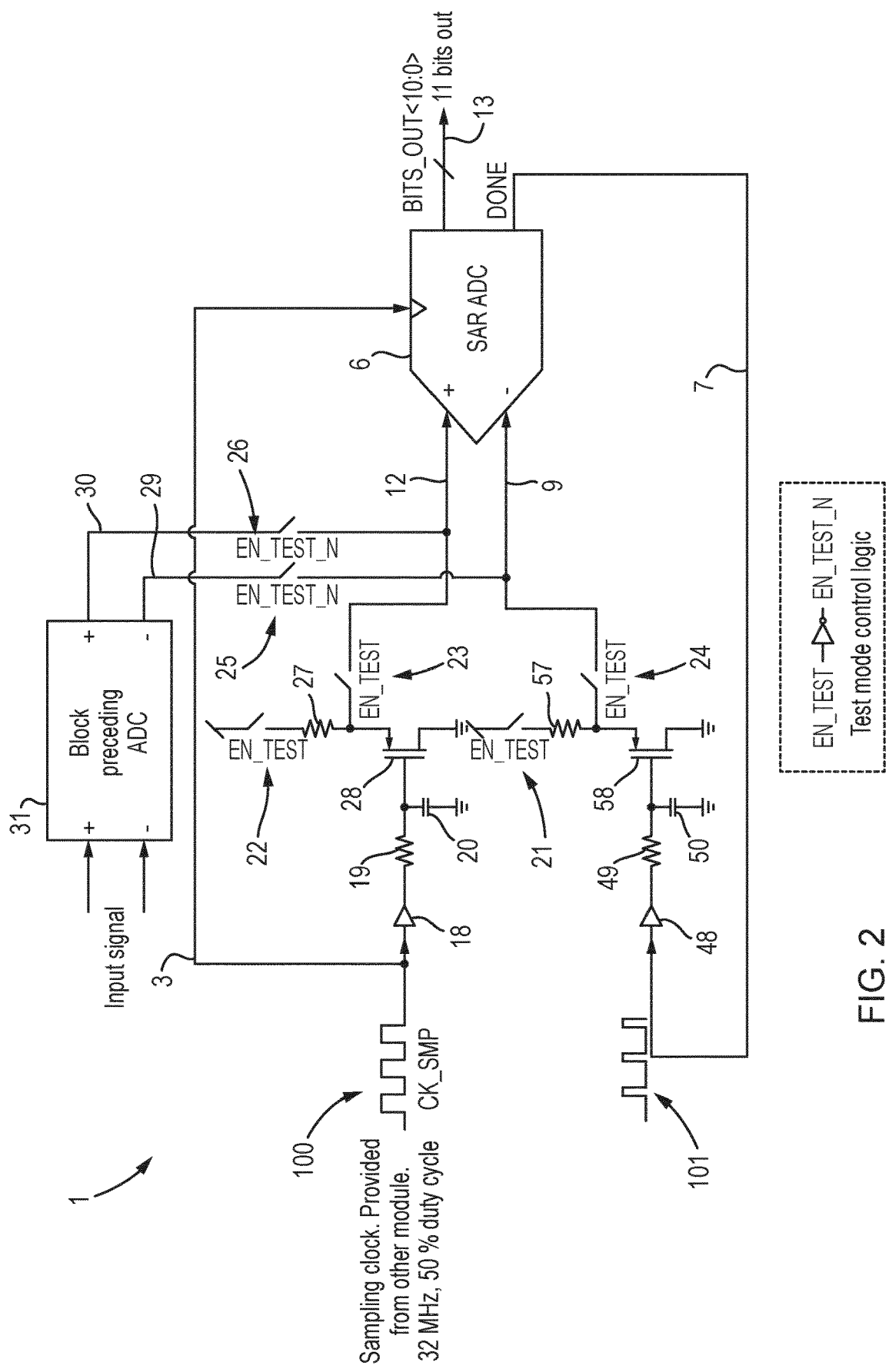
FIG. 2 is a schematic showing a simplified practical implementation of the circuit portion embodying the invention.

FIG. 2 shows the circuit portion 1 of FIG. 1 in more detail. FIG. 2 has many of the same features of FIG. 1. However, FIG. 2 shows an additional block (labelled "block preceding ADC") 31 which represents a further circuit portion that uses the SAR ADC in normal operation. The further circuit portion thus 31 has a differential connection 29, 30 to the inputs 12, 9 of the SAR ADC 6 via respective switches 25, 26.

As previously described, the sampling clock signal 100 is provided to one channel of the low pass filter block 2, shown here as comprising a digital buffer 18, a resistor 19 and a capacitor 20 connected to ground. The low pass filter channel is connected to the gate of a p-channel Metal Oxide Semiconductor Field Effect Transistor (pMOSFET) 28 forming part of one channel of the buffer block 4. The source of the pMOSFET 28 is connected to the positive supply rail via a switch 22 and a resistor 27. The drain of the pMOSFET 28 is connected to ground. The source of the pMOSFET 28 is also connected to the non-inverting SAR ADC input 12 via another switch 23.

Similarly, the feedback signal 101 is provided to the other channel of the low pass filter block 2, shown here as comprising a digital buffer 48, a resistor 49 and a capacitor 50 connected to ground. The second low pass filter channel is connected to the gate of a second pMOSFET 58 comprising a source follower providing part of the second channel of the buffer block 4 referred to above. The source of the pMOSFET 58 is connected to the positive supply rail via a switch 21 and a resistor 57. The drain of the pMOSFET 58 is connected to ground. The source of the pMOSFET 58 is also connected to the inverting SAR ADC input 9 via a further switch 23.

The switches 21,22, 23, 24, 25, 26 mentioned above determine which parts of the circuit are disconnected and connected in a test mode and during normal operation respectively as will be described below.

The operation of the circuit will now be described. Arrows are provided in FIGS. 1 and 2 to show how the signals are carried through the circuit.

The signals that control the switches 21,22, 23, 24, 25, 26 are labelled EN_TEST and EN_TEST_N. These signals are the inverse of each other. When EN_TEST is high, then EN_TEST_N is low. In such a configuration, only switches 21, 22, 23, 24 are closed and the test circuit is in a test mode. If EN_TEST is low, then EN_TEST_N is high. In this configuration, only switches 25, 26 are closed and the circuit operates in a normal operation mode.

In normal mode, the SAR ADC 6 performs analogue to digital conversions on the data from the further circuit portion 31.

The operation of the circuit portion 1 in a test mode will now be described with reference to FIGS. 1-5.

When operating in the test mode, switches 21, 22, 23, 24 are closed and switches 25, 26 are open. This provides the configuration comprising the SAR ADC 6, the low-pass filter block 2 and the buffer block 4 shown in FIG. 1.

During the test mode, the SAR ADC 6 receives an analogue differential input wherein one input 12 is derived (as will be explained below) from the sampling clock 10 which provides a 32 MHz reference signal 100 with a duty cycle of 50%. The other input 9 of the SAR ADC is derived from the feedback signal 101 which is also described further below.

The SAR ADC 6 begins the known process of analogue to digital conversion using the Successive Approximation Register approach which is not described in detail here in the interests of brevity. When sampling begins the SAR ADC 6 sets the feedback output (herein referred to as the DONE output) 7 to logic low. When the conversion is finished, e.g. after a time of the order of a few nanoseconds, the feedback output 7 is set to logic high. Thus, the duty cycle of the feedback signal 101 (and thus the pulse width) will contain information about the duration of the conversion and thus, implicitly the timing margin (i.e. how much shorter the duration is than the maximum allowable conversion time). A smaller pulse width (or lower duty cycle) represents a longer conversion time (and a slower SAR ADC). Larger pulse widths (or higher duty cycles) represent shorter conversion times (and a faster SAR ADC).

The feedback signal 101 is fed back to the SAR ADC 6 via the other channel of the low-pass filter block 2 and buffer block 4.

By low-pass filtering the feedback signal 101, the result is a DC voltage 8 that represents (e.g. is proportional to) the pulse width of the feedback signal 7. The buffered feedback DC voltage is then fed into the SAR ADC inverting input 9 as previously described.

The reference clock signal 100 is filtered and buffered in the same manner as the feedback signal 101. Specifically, the reference signal is fed through the other channel of the low-pass filter block 2 which outputs a DC voltage 11 representing the duty cycle of the clock (50%). This is fed through the other channel of the buffer block 4. The buffered reference DC voltage is then fed to the SAR ADC inverting input 12.

As mentioned above, the first sub-portion (which filters and buffers the reference signal 100) and second sub-portion (which filters and buffers the feedback signal 101) have identical components. This means that both signals 100, 101 are processed in the same way. Therefore, other factors such as PVT variations will cancel out so that the DC voltages representing the reference and feedback duty cycles can be more accurately compared by the SAR ADC. For example, the buffer block 4 adds a DC offset which is dependent on PVT. However, this cancels at the differential input 9,12 of the SAR ADC 6.

The SAR ADC 6 thus effectively carries out a comparison of the reference and feedback duty cycles by comparing the respective DC voltages provided to its two inputs 9, 12. The difference is thereby encoded in the output signal 13 generated by the SAR ADC 6. As the SAR ADC 6 has 11 bits, thus, it can output $2^{11}$=2048 possible values (which herein are referred to as codes). For a negative input signal, the codes have a range of 0 to 1023, while for a positive input signal the output codes have a range of 1024 to 2047.

Output digital codes 13 from the SAR ADC 6 comprise information related to the conversion time—i.e. the time taken for the SAR ADC 6 to perform an analogue to digital conversion relative to the reference provided by the clock signal 10. In this example, the SAR ADC output codes 13 are proportional to the timing margin of the conversion.

This means that even though SAR ADCs perform bit conversions asynchronously to the sampling clock and that the conversion time can vary significantly over PVT variations and with layout parasitics (e.g. parasitic capacitance and inductance), the comparison (carried out by the SAR ADC itself) provides a number indicating the timing margin. This is useful when testing the SAR ADC in the lab or when performing automatic production adjustments of the SAR ADC supply voltage as explained below.

As well as the resulting output codes 13 being available—e.g. for quality control purposes, the embodiment shows that it is possible that they are also fed to a control unit 14 which adjusts the power supply voltage 16 to the SAR ADC 6. Since the conversion time of an SAR ADC has an inverse relationship with the supply voltage, a naturally short conversion time (e.g. as a result of process variations) can be exploited by reducing the supply voltage whilst still achieving an acceptable timing margin. Conversely a longer conversion time can be compensated for by increasing the supply voltage without having to do this on a precautionary basis for all chips.

Once the timing margin has been measured (and possibly the supply voltage adjusted accordingly) the switches 21, 22, 23, 24, 25, 26 are inverted to place the circuit in the normal mode.

In a typical example the sampling clock 10 has a frequency of 32 MHz, and a duty cycle of 50%. This frequency gives a period of 31.25 ns, and means that the SAR ADC 6 only has 31.25/2 ns=15.63 ns to finish a conversion.

Figure 3:
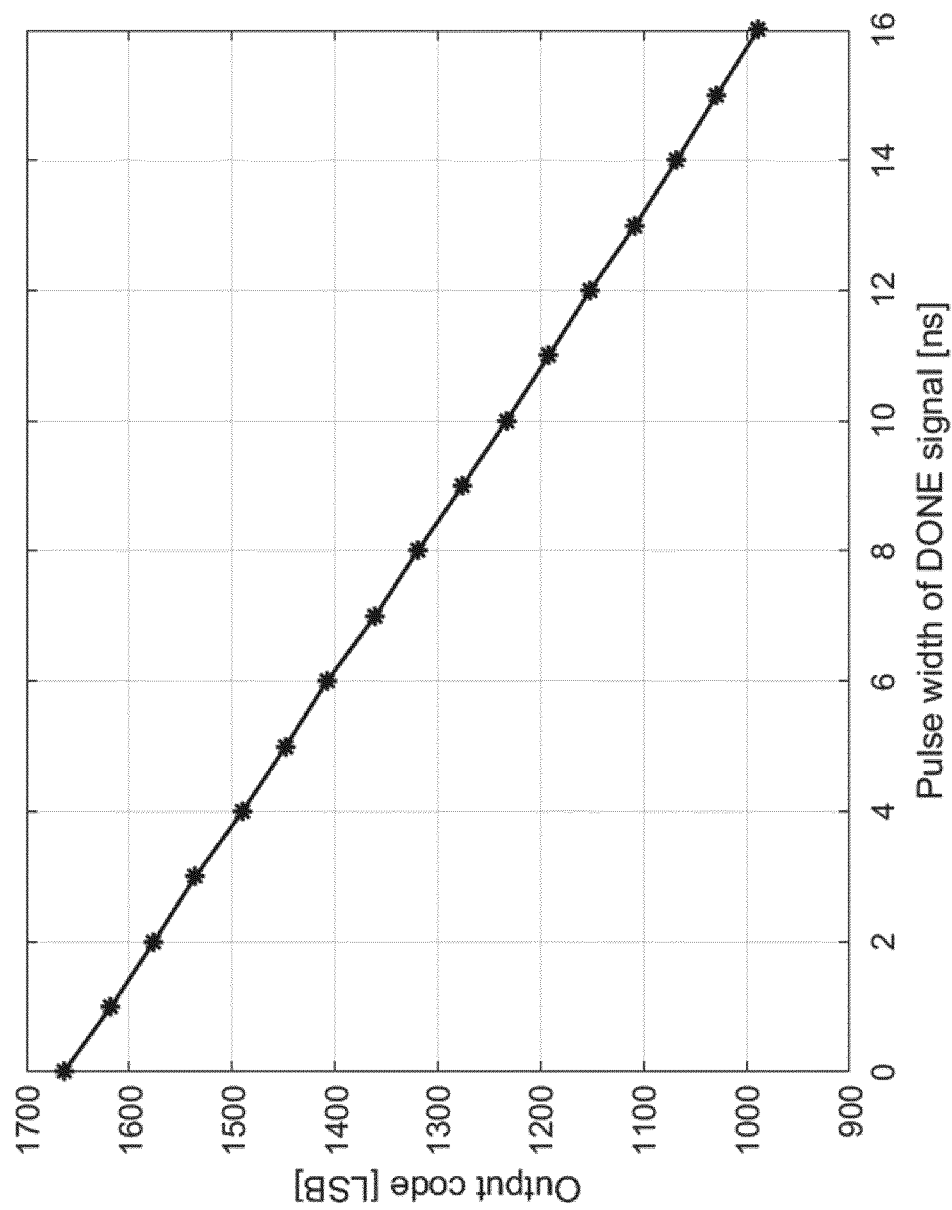
FIG. 3 is a graph showing the proportional relationship between the output code from the SAR ADC and the pulse width of the feedback (DONE) signal.

FIG. 3 shows the relationship between the output codes 13 and the pulse width of the feedback signal 101. The graph is plotted with data points obtained in a simulation test. The y-axis has the units LSB (least significant bit) and the x-axis has units of nanoseconds (ns).

In the simulation test, the pulse-width of the feedback signal 101 was swept and the output codes (e.g. 13) from the SAR ADC 6 were checked. The graph in FIG. 3 shows a linear relationship between the output codes and the pulse width of the feedback signal 101. It is observed that the value of the output code 13 is inversely proportional to the pulse-width of the feedback signal 101. As the feedback signal 101 is driven high when the conversion is done, a small pulse width represents a longer conversion time. When the pulse-width is small (a slow ADC), then the output codes are higher. Therefore, a pass/fail criterion may be set by looking at the output codes.

Figure 4:
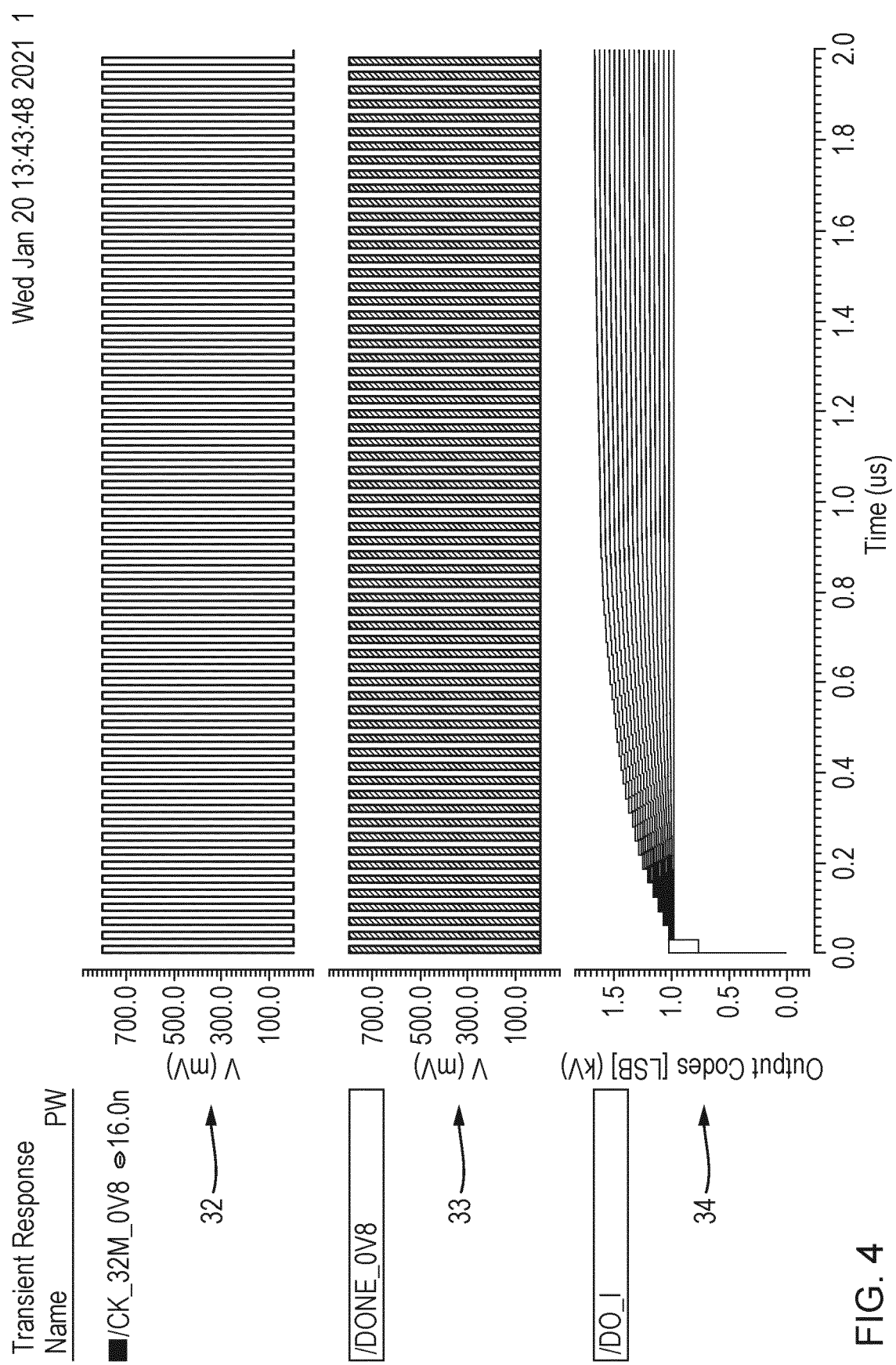
FIG. 4 is a collection of graphs showing raw simulation results of the test mode for a range of pulse widths.

FIG. 4 shows results of another simulation test. In this simulation test, the pulse width of the feedback signal 101 was swept from 0 ns to 16 ns in steps of 1 ns and the corresponding output codes were recorded over 2 microseconds.

The results are shown in three graphs 32, 33, 34. The uppermost graph 32 shows the voltage of the reference signal input from the clock (CK_32M_0V8) as a function of time. The middle graph 33 again shows the voltage of the sixteen overlapping waveforms representing the feedback signal sweep (DONE_0V8) as a function of time.

The lowermost graph 34 shows the voltage of the least significant bit of the output code as a function of time. Sixteen lines are plotted on the lowermost graph 34 corresponding to the sixteen waveforms on the middle graph 33.

From the lowermost graph 34 it can be seen that the SAR ADC 6 output code starts at a certain value, increases and then settles to a final value. The final value is inversely proportional to the pulse width of the feedback signal 101. It takes some time for the output to settle due to the filtering carried out by the processing circuitry. But settling is observed after around 2 microseconds. Therefore, the test quickly settles on a result.

Figure 5:
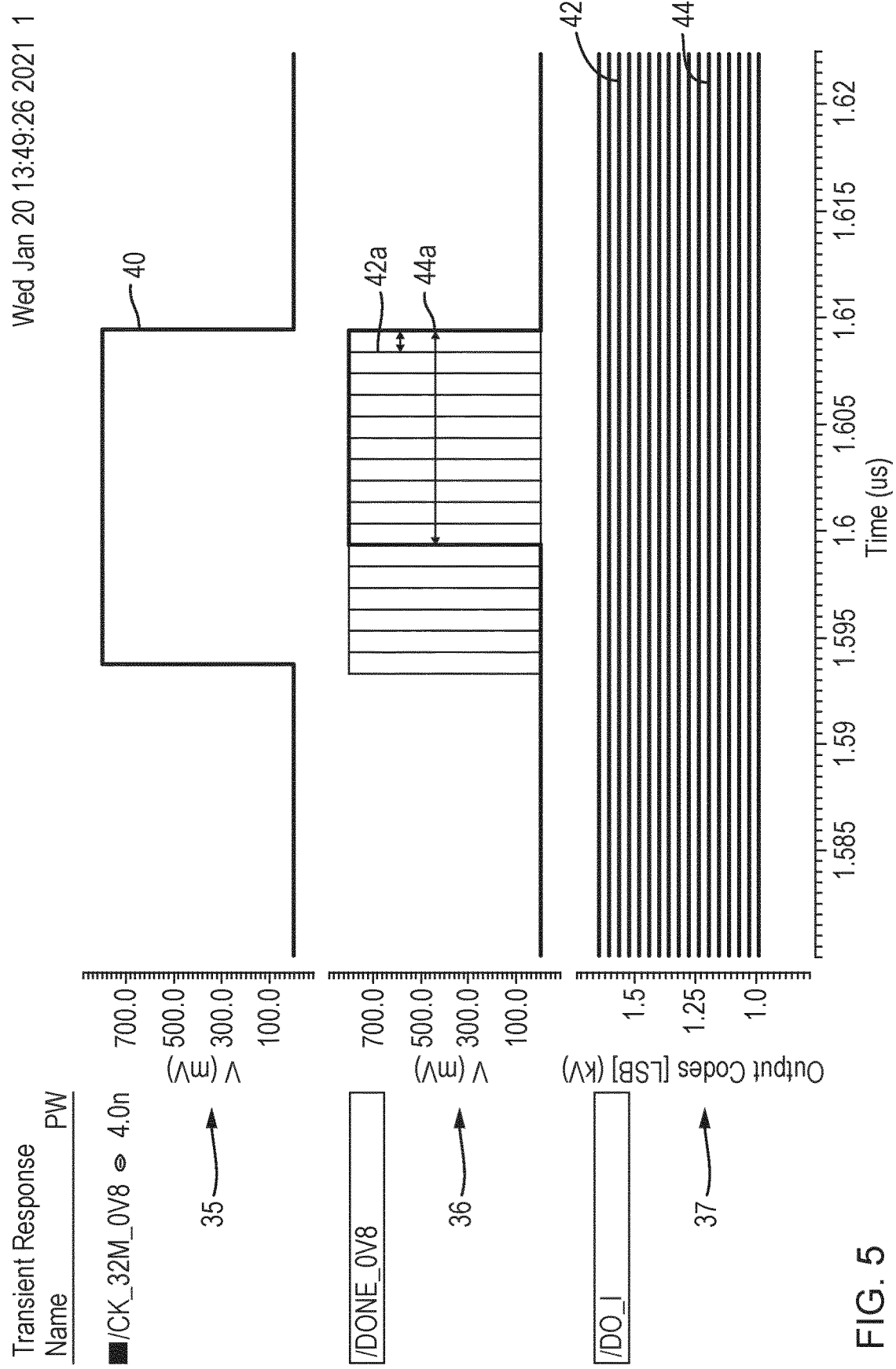
FIG. 5 shows a more detailed view of a region of the graphs shown in FIG. 4.

FIG. 5 shows a 'zoomed-in' region of the graphs of FIG. 4. In FIG. 5, the uppermost graph 35 corresponds to the uppermost graph 32 of FIG. 4; the middle graph 36 corresponds to the middle graph 33 of FIG. 4; and the lowermost graph 37 corresponds to the lowermost graph 34 of FIG. 4. In FIG. 5, the scale of the x-axis is changed and ranges from 1.58 to 1.625 microseconds.

A single clock pulse 40 of the reference signal 100 is seen in the uppermost graph 35. The middle graph 36 shows sixteen feedback signals 101 having various pulse widths. An example of a very short pulse width 42a is shown by the short double-headed arrow. The lowermost graph 37 shows the corresponding output code 42b for that short pulse width 42a. The middle graph 36 also shows a larger pulse width 44a denoted by a longer double headed arrow. This larger pulse width 44a corresponds to the lower output code 44b on the lowermost graph 37.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A circuit portion arranged to be operable in a test mode, comprising:
   an input for a reference signal; and
   a Successive Approximation Register Analog to Digital Converter (SAR ADC) arranged to:
      generate a feedback signal having a duty cycle representing a time taken for the SAR ADC to complete an analogue to digital conversion;
      carry out a comparison of a duty cycle of the reference signal with the duty cycle of the feedback signal; and
      generate an output signal comprising a digital representation of the comparison of the duty cycle of the reference signal and the duty cycle of the feedback signal.

2. The circuit portion of claim 1, comprising:
   a first sub-portion arranged to generate a reference DC voltage representative of the reference duty cycle; and
   a second sub-portion arranged to generate a feedback DC voltage representative of the feedback duty cycle;
   wherein the SAR ADC is arranged to compare the reference DC voltage with the feedback DC voltage.

3. The circuit portion of claim 2, wherein the first and second sub-portions are identical to one another.

4. The circuit portion of claim 2, wherein the first and second circuit sub-portions comprise respective low-pass filters.

5. The circuit portion of claim 2, wherein the first and second circuit sub-portions further comprise respective buffers.

6. The circuit portion of claim 1, wherein the circuit portion comprises a clock.

7. The circuit portion of claim 1, wherein the SAR ADC sets the feedback signal to logic low when a sampling stage begins and logic high when the analogue to digital conversion is done.

8. The circuit portion of claim 1, wherein the comparison comprises determining a value proportional to a timing margin of the analogue to digital conversion.

9. The circuit portion of claim 1, wherein the circuit portion is configurable to selectively connect a further circuit portion to the SAR ADC, so as to operate in a normal mode when the further circuit portion is connected to the SAR ADC and in a test mode when the further circuit portion is not connected to the SAR ADC.

10. The circuit portion of claim 9, wherein the circuit portion comprises a plurality switches for selection of said normal and test modes.

11. The circuit portion of claim 1, wherein the SAR ADC comprises a differential input.

12. The circuit portion of claim 1, wherein the circuit portion comprises a power supply arranged to provide a supply voltage to the SAR ADC, the supply voltage being set based on the comparison of the duty cycle of the reference signal and duty cycle of the feedback signal.

13. The circuit portion of claim 12, wherein the supply voltage is set automatically by a control unit.

14. A method for testing a Successive Approximation Register Analog to Digital Converter (SAR ADC), the method comprising the SAR ADC in a test mode:
generating a feedback signal having a duty cycle representing a time taken for the SAR ADC to complete an analogue to digital conversion;
carrying out a comparison of a duty cycle of a reference signal with the duty cycle of the feedback signal; and
generating an output signal comprising a digital representation of the comparison of the duty cycle of the reference signal and the duty cycle of the feedback signal.

* * * * *